(12) United States Patent
Lee et al.

(10) Patent No.: US 12,455,501 B2
(45) Date of Patent: *Oct. 28, 2025

(54) BLANK MASK AND PHOTOMASK USING THE SAME

(71) Applicant: SK enpulse Co., Ltd., Pyeongtaek-si (KR)

(72) Inventors: GeonGon Lee, Seoul (KR); Suk Young Choi, Seoul (KR); Hyung-joo Lee, Seoul (KR); Sung Hoon Son, Seoul (KR); Seong Yoon Kim, Seoul (KR); Min Gyo Jeong, Seoul (KR); Taewan Kim, Seoul (KR); Inkyun Shin, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 543 days.

This patent is subject to a terminal disclaimer.

(21) Appl. No.: 17/898,749

(22) Filed: Aug. 30, 2022

(65) Prior Publication Data
US 2023/0083755 A1   Mar. 16, 2023

(30) Foreign Application Priority Data
Sep. 3, 2021   (KR) .................. 10-2021-0117417

(51) Int. Cl.
*G03F 1/32*   (2012.01)
*G03F 1/50*   (2012.01)
*G03F 1/60*   (2012.01)

(52) U.S. Cl.
CPC . *G03F 1/32* (2013.01); *G03F 1/50* (2013.01)

(58) Field of Classification Search
None
See application file for complete search history.

(56) References Cited

U.S. PATENT DOCUMENTS

| | | | | |
|---|---|---|---|---|
| 2013/0065166 A1* | 3/2013 | Iwashita | ................. | G03F 1/26 430/5 |
| 2013/0273738 A1* | 10/2013 | Sakai | ................. | G03F 1/50 438/689 |
| 2015/0301442 A1* | 10/2015 | Kageyama | ................. | G03F 1/38 204/192.15 |

(Continued)

FOREIGN PATENT DOCUMENTS

| | | |
|---|---|---|
| CN | 106200256 A | 12/2016 |
| JP | S60-107651 A | 6/1985 |

(Continued)

OTHER PUBLICATIONS

Chinese Office Action issued on Aug. 2, 2025, in corresponding Chinese Patent Application No. 202211047392.8. (7pages in English, 7pages in Chinese).

*Primary Examiner* — Martin J Angebranndt
(74) *Attorney, Agent, or Firm* — NSIP Law (57) ABSTRACT

A blank mask including a transparent substrate and a light shielding film disposed on the transparent substrate, wherein the light shielding film includes a transition metal and at least one selected from the group consisting of oxygen and nitrogen, and wherein a surface of the light shielding film has a first contact angle of 40° to 45° measured by using diiodo-methane as a first liquid contacting the surface of the light shielding film, is disclosed.

15 Claims, 1 Drawing Sheet

(56) References Cited

U.S. PATENT DOCUMENTS

| | | | |
|---|---|---|---|
| 2016/0077424 A1* | 3/2016 | Fukaya | G03F 1/50 |
| | | | 430/5 |
| 2017/0023854 A1 | 1/2017 | Nam et al. | |
| 2017/0139316 A1* | 5/2017 | Shishido | G03F 1/32 |
| 2017/0242330 A1 | 8/2017 | Hanekawa | |
| 2022/0357647 A1* | 11/2022 | Lee | G03F 1/58 |
| 2022/0397819 A1* | 12/2022 | Lee | G03F 1/54 |
| 2023/0030141 A1* | 2/2023 | Lee | G03F 1/84 |
| 2023/0110529 A1* | 4/2023 | Lee | G03F 1/46 |
| | | | 430/5 |
| 2023/0213849 A1* | 7/2023 | Lee | G03F 1/58 |
| | | | 430/5 |
| 2023/0418150 A1* | 12/2023 | Lee | G03F 1/54 |
| 2024/0192584 A1* | 6/2024 | Lee | G03F 1/54 |

FOREIGN PATENT DOCUMENTS

| | | | | |
|---|---|---|---|---|
| JP | 2002-316107 A | 10/2002 | | |
| JP | 2004-53663 A | 2/2004 | | |
| JP | 2006-103030 A | 4/2006 | | |
| JP | 2007-183328 A | 7/2007 | | |
| JP | 2008-209739 A | 9/2008 | | |
| JP | 2015-88746 A | 5/2015 | | |
| JP | 2016-38458 A | 3/2016 | | |
| JP | 2017-151427 A | 8/2017 | | |
| JP | 2020-74053 A | 5/2020 | | |
| JP | 2022-187986 A | 12/2022 | | |
| JP | 2023-12424 A | 1/2023 | | |
| KR | 10-2007-0114025 A | 11/2007 | | |
| KR | 10-2008-0093443 A | 10/2008 | | |
| KR | 10-2011-0044123 A | 4/2011 | | |
| KR | 2013051879 A * | 5/2013 | | |
| KR | 2392332 B1 * | 4/2022 | | G03F 1/26 |
| SG | 10202250092 F | 1/2023 | | |
| TW | 202130674 A | 8/2021 | | |
| TW | 202130746 A | 8/2021 | | |
| TW | 202132476 A | 9/2021 | | |
| TW | 202132477 A | 9/2021 | | |
| WO | WO-2006123630 A1 * | 11/2006 | | C23C 14/0641 |
| WO | WO 2011/155602 A1 | 12/2011 | | |

\* cited by examiner

BLANK MASK AND PHOTOMASK USING THE SAME

TECHNICAL FIELD

The present disclosure relates to a blank mask and a photomask using the same.

BACKGROUND ART OF THE INVENTION

Due to high integration of semiconductor devices or the like, miniaturization of circuit patterns of semiconductor devices is on demand. For this reason, the importance of a lithography technique, which is a technique for developing a circuit pattern on a wafer surface using a photomask is being further emphasized.

For developing a miniaturized circuit pattern, a light source of exposure used in an exposure process (photolithography) is required to have a short wavelength. As the light source of exposure used recently, there is ArF excimer laser (wavelength of 193 nm) or the like.

On the other hand, there are Binary mask, Phase shift mask, and the like as photomasks.

The Binary mask has a structure in which a light shielding layer pattern is formed on a transparent substrate. In a surface where a pattern is formed from the Binary mask, a transmissive portion not including a light shielding layer allows exposure light to be transmitted, and a light shielding portion including a light shielding layer shields exposure light, to transfer a pattern on resist film of the surface of a wafer. However, the Binary mask may cause a problem in the development of a minute pattern due to diffraction of light occurring at the edge of the transmissive portion as the pattern is being more miniatured.

As a phase shift mask, there are Levenson type, Outrigger type, and Half-tone type. Among the above, Half-tone type phase shift mask has a structure in which a pattern formed with semi-transmissive films is formed on a transparent substrate. In a surface where a pattern is formed from the Half-tone type phase shift mask, a transmissive portion not including a semi-transmissive layer allows exposure light to be transmitted, and a semi-transmissive portion including a semi-transmissive layer allows attenuated exposure light to be transmitted. The attenuated exposure light is allowed to have a phase difference compared to exposure light which has gone through the transmissive portion. Accordingly, diffraction light occurring at the edge of the transmissive portion is counteracted by the exposure light which has penetrated the semi-transmissive portion, and thereby the phase shift mask can form a further refined minute pattern on the surface of a wafer.

RELATED PRIOR ART

Patent Document (Patent Document 0001) Korean Patent Publication No. 10-2007-0114025

CONTENTS OF THE INVENTION

Problem to be Solved

The purpose of the present disclosure is to provide a blank mask from which particles can be easily removed by a cleaning solution and which can exhibit excellent adhesion to a resist film when the resist film is coated on an upper surface, and a photomask using the same.

Means for Solving the Problem

A blank mask according to one embodiment of the present specification includes a transparent substrate and a light shielding film disposed on the transparent substrate.

The light shielding film includes a transition metal, and at least any one between oxygen and nitrogen.

The light shielding film has a contact angle of 40° to 45° measured by diiodo-methane.

A surface of the light shielding film has an Rsk value of −1 to 0.

The surface of the light shielding film has an Rku value of 7 or less.

A ratio of a dispersion component of a surface energy of the light shielding film to the surface energy of the light shielding film may be 0.84 to 0.865.

The dispersion component of the surface energy of the light shielding film may have a value of 37 mN/m to 40 mN/m.

The light shielding film may have the surface energy of 43 mN/m to 47 mN/m.

The value of dividing the contact angle of the light shielding film measured by diiodo-methane by a contact angle of the light shielding film measured by pure water may be equal to or more than 0.58 and less than or equal to 0.604.

The surface of the light shielding film may have an Rku value of 2 or more.

The light shielding film may include a first light shielding layer and a second light shielding layer disposed on the first light shielding layer.

An amount of a transition metal of the second light shielding layer may have a larger value than an amount of a transition metal of the first light shielding layer.

The transition metal may include at least any one among Cr, Ta, Ti, and Hf.

A photomask according to another embodiment of the present application includes a transparent substrate and a light shielding pattern film disposed on the light transmitting substrate.

The light shielding pattern film may include a transition metal, and at least any one between oxygen and nitrogen.

An upper surface of the light shielding pattern film may have a contact angle of 40° to 45° measured by diiodo-methane.

The upper surface of the light shielding pattern film may have an Rsk value of −1 to 0.

The upper surface of the light shielding pattern film may have an Rku value of 7 or less.

A manufacturing method of a semiconductor element according to another embodiment of the present application includes preparation of disposing a light source, a photomask and a semiconductor wafer where a resist film have been applied, an exposure operation of selectively transmitting a light incident from the light source through the photomask on the semiconductor wafer to be transferred, and a development operation of developing a pattern on the semiconductor wafer.

The photomask includes a transparent substrate and a light shielding pattern film disposed on the transparent substrate.

The light shielding pattern film may include a transition metal and at least any one between oxygen and nitrogen.

An upper surface of the light shielding pattern film may have a contact angle of 40° to 45° measured by diiodomethane.

The upper surface of the light shielding pattern film may have an Rsk value of −1 to 0.

The upper surface of the light shielding pattern film may have an Rku value of 7 or less.

Effect of the Invention

The blank mask and the like according to the present disclosure may allow easy removal of particles by a cleaning solution and may exhibit excellent adhesion to a resist film when the resist film is coated on an upper surface.

DETAILED DESCRIPTION FOR PRACTICING THE INVENTION

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this specification, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this specification, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this specification, the description of "A and/or B" means "A, B, or A and B."

Throughout this specification, terms such as "first", "second", "A", or "B" are used to distinguish the same terms from each other unless specially stated otherwise.

In this specification, "B being placed on A" means that B is placed in direct contact with A or placed over A with another layer or structure interposed therebetween and thus should not be interpreted as being limited to B being placed in direct contact with A.

In this specification, a singular form is contextually interpreted as including a plural form as well as a singular form unless specially stated otherwise.

In this specification, the surface profile refers to an outline observed at the surface.

The Rsk value is a value evaluated based on ISO_4287. The Rsk value shows skewness of the surface profile as a measuring target.

The Rku value is a value evaluated based on ISO_4287. The Rku value shows kurtosis of the surface profile as a measuring target.

The peak is a portion placed on the upper portion of a reference line (referring a height average line from the surface profile) from the surface profile of a light shielding film.

The valley is a portion placed on the lower portion of a reference line (referring a height average line from the surface profile) from the surface profile of a light shielding film.

The present specification illustrates a resist film for an example of a thin film formed in contact with a light shielding film, however, the characteristics of the present disclosure can be applied to all thin films that can be formed in contact with a light shielding film and be removed in subsequent processes. The thin film formed in contact with a light shielding film is not limited to a resist film.

Due to high integration of semiconductor devices, a further miniaturized circuit pattern is required to be formed on the semiconductor wafer. As the critical dimension (CD) of a pattern developed on a semiconductor wafer is more decreased, issues related to the degradation of resolution of a photomask is on an increased trend.

A light shielding film comprised in a blank mask may be formed into a light shielding pattern film by cleaning the light shielding film for removal of particles, coating a resist film on the light shielding film and patterning thereof. In this process, some particles may remain on the surface of the light shielding film after cleaning, and a problem of the light shielding film failed in being elaborate patterned as a predesigned pattern shape may occur.

Inventors of the present disclosure ascertained that the above problems can be solved by controlling the surface energy and roughness characteristics of a light shielding film, and completed the embodiments.

Hereinafter, a detailed description of the present disclosure will be made.

Figure 1:
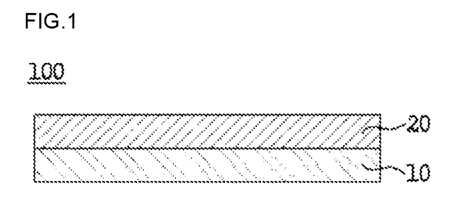
FIG. 1 is a conceptual view for illustrating a blank mask according to one embodiment disclosed by the present application.

FIG. 1 is a conceptual view for illustrating a blank mask according to one embodiment disclosed in the present application. With reference to the FIG. 1, a blank mask of an embodiment is described.

A blank mask 100 comprises a transparent substrate 10 and a light shielding film disposed on the transparent substrate 10.

The material of a transparent substrate is not limited and any material having a light transmissive characteristic with respect to an exposure light to be applicable to a blank mask can be applied. In detail, the transmittance with respect to an exposure light with the wavelength of 193 nm of the transparent substrate 10 may be 85% or more. The transmittance may be 87% or more. The transmittance may be 99.99% or less. For example, the transparent substrate 10 may be a synthetic quartz substrate. In such a case, the transparent substrate 10 can suppress attenuation of a light transmitting the transparent substrate 10.

Additionally, surface characteristics such as smoothness and roughness of the transparent substrate 10 can be adjusted and thereby the occurrence of optical distortion can be suppressed.

The light shielding film 20 may be disposed on the top side of the light transmitting substrate 10.

The light shielding film 20 may have a characteristic of blocking at least some of an exposure light incident to the bottom side of the transparent substrate 10. Also, when a phase shift film 30 (refer to FIG. 3) is disposed between the transparent substrate 10 and the light shielding film 20, the light shielding film 20 may be used as an etching mask in a process of etching the phase shift film 30 and the like to be the pattern shape.

The light shielding film 20 comprises a transition metal, and at least any one between oxygen and nitrogen.

Characteristics Related to Surface Energy of Light Shielding Film

A light shielding film 20 has a contact angle of 40° to 45° measured by diiodo-methane.

Organic particles present in air or caused from a worker during processes of storage and movement may be absorbed to a blank mask. For removing such particles, a resist film may be coated on a light shielding film 20 after a cleaning process is performed for the surface of the light shielding film 20. Coating of the resist film may be performed on the surface of the light shielding film 20 without a separate treatment, or may be performed after application of a material as an adhesion improver such as HMDS (Hexamethyldisilazane) and other organic silane-based compounds.

Even though a cleaning process is performed by applying the same cleaning solution and cleaning method, the cleaning effect may be difference depending on the surface characteristic of the light shielding film 20. The embodiment can control roughness characteristics, compositions, process conditions of thermal treatment and cooling treatment, and the like. At the same time, the embodiment can control the contact angle of the light shielding film measured by diiodo-methane within a predetermined range in the embodiment. Through the above, the repulsive force between the particles and the surface of the light shielding film 20 can be increased and thereby particles can be easily removed from the surface of the light shielding film 20. At the same time, even though the light shielding film 20 is not processed for the surface by adhesion improver, the light shielding film 20 can have a stabler adhesive force with respect to a resist film having a hydrophobicity.

The contact angle of the light shielding film 20 measured by diiodo-methane is measured through Goniometer method by using a surface analyzer. In detail, the surface of the light shielding film 20 is divided into total nine sectors by trisecting vertically and horizontally. Diiodo-methane of 0.8 to 1.2 μm, for example, diiodo-methane of 1 μm is dropped to the center of each sector, and the contact angle of diiodo-methane of each sector is measured, and the average value of measured contact angles of each sector is calculated as a contact angle of the light shielding film 20 measured by diiodo-methane.

The diiodo-methane used for measurement has a surface energy of 50.8 mN/m, and polar component of 0 mN/m and dispersion component of 50.8 mN/m are comprised in the surface energy.

For example, the contact angle of the light shielding film 20 measured by diiodo-methane is measured through a MSA (Mobile Surface Analyzer) double type model available from KRÜSS corporation.

For example, the contact angle of the light shielding film 20 measured by diiodo-methane may be equal to or less than 40° and equal to or less than 45°. The contact angle may be 42° or more. The contact angle may be 42.5° or more. The contact angle may be 44.8° or less. The contact angle may be 43.8° or less. In such a case, organic particles present on the surface of the light shielding film 20 can be easily removed. Also, when a resist film is coated on the light shielding film 20 not additionally treated for the surface, the adhesive force between the light shielding film 20 and the resist film can have a stable adhesive strength.

The ratio of the dispersion component of the surface energy of the light shielding film compared to the surface energy of the light shielding film 20 may be 0.84 to 0.865.

The cleaning solution applied in a process for cleaning the light shielding film 20 may be SC-1 solution, ammonia water, oxygenated water, or the like, and a solution having a relatively high polarity is applied. The cleaning solution may be in contact with the surface of the light shielding film 20 activated through light irradiation or the like and thereby can remove organic matters absorbed on the surface of the light shielding film 20. However, such a cleaning solution has a high reactivity and when remaining on the surface of the light shielding film 20, may cause damage of the surface of the light shielding film 20. Therefore, the cleaning solution is required to be removed from the surface of the light shielding film 20 after completion of a cleaning process.

The surface energy value is the sum of the dispersion component and polar component of the surface energy. Even though having the same surface energy value, the light shielding film 20 can have different characteristics in the surface depending on the value of dispersion component compared to the surface energy. By controlling the ratio of the dispersion component of the surface energy compared to the surface energy, the resist film can be stably coated on the light shielding film 20 has not been surface-treated. At the same time, the activated surface of the light shielding film 20 is allowed to have further high affinity with respect to a cleaning solution and particles remaining on the surface of the light shielding film 20 can be more efficiently removed.

The surface energy of the light shielding film 20 and the dispersion component of the surface energy is measured through Goniometer method by using a surface analyzer. In detail, the surface of the light shielding film 20 is trisected vertically and horizontally and divided into total nine sectors. Pure water is dropped by 0.8 to 1.2 μm, for example 1 μm, with the interval of about 2 seconds and the contact angle of pure water of each sector is measured by using a surface analyzer. After that, the average value of measuring values of contact angles of respective sectors is calculated as the contact angle of the light shielding film 20 measured by pure water. After 2 seconds from the dropping of pure water, diiodo-methane of 0.8 to 1.2 μm, for example, diiodo-methane of 1 μm is dropped at a position spaced apart from the position where pure water has been dropped to measure the contact angle of diiodo-methane, and the average value of measuring values of contact angles of respective sectors is calculated as the contact angle of the light shielding film 20. The surface energy, the dispersion component value and the polar component value of the surface energy of the light shielding film 20 are calculated from the contact angle of pure water and diiodo-methane measured from the light shielding film 20.

The surface energy of pure water used in the measurement is 72.8 mN/m. Polar component of the surface energy of the pure water is 51 mN/n. Dispersion component of the surface energy of the pure water is 21.8 mN/m. The surface energy of diiodo-methane used in the measurement is 50.8 mN/m. Polar component of the surface energy of the diiodo-methane is 0 mN/m. The dispersion component of the diiodo-methane is 50.8 mN/m.

For example, the ratio of the dispersion component of the surface energy of the light shielding film compared to the surface energy of the light shielding film 20 may be measured through MSA (Mobile Surface Analyzer) double type available from KRUSS corporation.

The ratio of the dispersion component of the surface energy of the light shielding film 20 compared to the surface energy of the light shielding film 20 may be equal to or more than 0.84 and less than or equal to 0.865. The ratio may be 0.842 or more. The ratio may be 0.85 or more. The ratio may be 0.8605 or less. The ratio may be 0.86 or less. In such a case, dislocation of a resist pattern film from the surface of the light shielding film 20 may be suppressed during a patterning process. Furthermore, the cleaning effect by a cleaning solution can be further improved during a cleaning operation.

The value of dispersion component of the surface energy of the light shielding film may be 37 mN/m to 40 mN/m. The value of dispersion component may be 37.5 mN/m or more. The value of dispersion component may be 39 mN/m or less. The value of dispersion component may be 38.5 mN/m or less. The value of dispersion component may be 38 mN/m or less. In such a case, while the degree of absorption of particles on the surface of the light shielding film 20 is decreased, a resist film can be stably formed on the surface of the light shielding film 20.

The surface energy of the light shielding film 20 may be 43 to 47 mN/m. The surface energy of the light shielding film 20 may be 43.5 mN/m or more. The surface energy of the light shielding film 20 may be 44 mN/m or more. The surface energy of the light shielding film 20 may be 46 mN/m or less. The surface energy of the light shielding film 20 may be 45.5 mN/m or less. In such a case, the revulsion force between an inactivated surface of the light shielding film 20 and a cleaning solution can be regulated, and organic particles can be effectively prevented from being adhered to the surface of the light shielding film 20.

The value of dividing the contact angle of the light shielding film 20 measured by diiodo-methane by the contact angle of the light shielding film 20 measured by pure water may be 0.58 to 0.604.

The value of the contact angle of the surface of the light shielding film 20 measured by a polar material and the value of the contact angle of the surface of the light shielding film 20 measured by a nonpolar material are regulated at the same time. Through the above, the cleaning solution can be easily removed from the surface of the light shielding film 20 where the activation effect has disappeared after completion of a cleaning process. Simultaneously, the repulsive force between particles comprising organic matters and the surface of the light shielding film 20 is increased, and thereby particles can be easily eliminated from the surface of the light shielding film 20.

The method of measuring the contact angle of the light shielding film measured by pure water is the same as the method of measuring the surface energy of the light shielding film described in the above.

The value of dividing the contact angle of the light shielding film 20 measured by diiodo-methane by the contact angle of the light shielding film 20 measured by pure water may be 0.58 to 0.604. The value may be 0.585 or more. The value may be 0.59 or more. The value may be 0.6 or less. The value may be 0.595 or less. In such a case, the convenience of cleaning the surface of the light shielding film 20 can be improved.

Characteristics Related to Surface Roughness of Light Shielding Film

The surface of the light shielding film 20 may have an Rsk value of −1 to 0, and an Rku value of 7 or less.

Before the formation of a resist film on the light shielding film 20, surface treatment may be performed for the light shielding film 20 by using a material as an adhesion improver. The surface treatment may be performed by a method of applying a material as an adhesion improver to the surface of the light shielding film 20.

The present disclosure can control the Rsk value and Rku value on the surface of the light shielding film 20 in addition to controlling the composition of the light shielding film 20, the surface energy thereof, and the conditions of thermal treatment and cooling treatment of the light shielding film 20. Through these, the adhesive force between the light shielding film 20 and a resist film may be improved, and absorption of particles on the surface of the light shielding film 20 can be suppressed.

In detail, the material as an adhesive improver can be applied in a relatively even height within the surface of the light shielding film 20, by controlling the skewness on the surface of the light shielding film 20. In addition, it is possible to eliminate the particles introduced from the external not to be absorbed on the surface of the light shielding film 20.

The Rsk value and Rku value of the surface of the light shielding film 20 may be adjusted at the same time. In such a case, it is possible to apply a material as an adhesion improver on the surface of the light shielding film 20 in a relatively even distribution overall, and the material can be stably maintained on the light shielding film 20 until the formation of a resist film on the light shielding film 20.

The method of measuring Rsk value and Rku value of the surface of light shielding film 20 is the same as below.

The Rsk value and Rku value are measured at an area of 1 μm vertically and horizontally placed on the center of the surface of the light shielding film 20. The Rsk value is measured in Non-contact mode by setting the scan speed to be 0.5 Hz in the area with two-dimensional roughness meter. For example, the Rsk value and Rku value may be measured by using XE-150 model available from PARK SYSTEM applied with PPP-NCHR which is Cantilever model available from PARK SYSTEM as a probe.

The surface of the light shielding film 20 may have an Rsk value of −1 to 0. The Rsk value may be −0.9 or more. The Rsk value may be −0.85 or more. The Rsk value may be −0.8 or more. The Rsk value may be −0.7 or more. The Rsk value may be −0.1 or less. The Rsk value may be −0.15 or less. The Rsk value may be −0.2 or less.

The Rku value of the surface of the light shielding film 20 may be 7 or less. The Rku value may be 6 or less. The Rku value may be 5 or less. The Rku value may be 2 or more.

In such a case, the improvement effect in the adhesive force between the light shielding film 20 and the resist film caused from a material as an adhesion improver can be further increased, and particles remaining on the surface of the light shielding film 20 can be easily removed.

Layer Structure and Composition of Light Shielding Film

Figure 2:
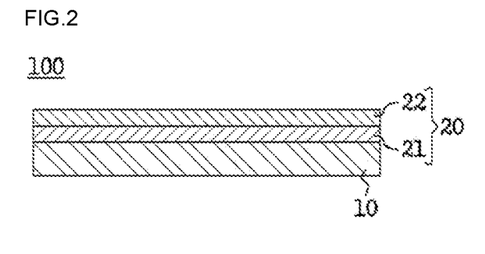
FIG. 2 is a conceptual view for illustrating a blank mask according to another embodiment disclosed by the present application.

FIG. 2 is a conceptual view for illustrating a blank mask according to another embodiment of the present application. With reference to the FIG. 2, an embodiment is described.

The light shielding film 20 may comprise a first light shielding layer 21 and a second light shielding layer 22 disposed on the first light shielding layer 21.

The second light shielding layer 22 may comprise a transition metal and at least any one between oxygen and nitrogen. The second light shielding layer 22 may comprise the transition metal in an amount of 50 to 80 at %. The second light shielding layer 22 may comprise the transition metal in an amount of 55 to 75 at %. The second light shielding layer 22 may comprise the transition metal in an amount of 60 to 70 at %.

The amount of an element corresponding to oxygen or nitrogen of the second light shielding layer 22 may be 10 to 35 at %. The element corresponding to oxygen or nitrogen of the second light shielding layer 22 may have an amount of 15 to 25 at %.

The second light shielding layer 22 may comprise nitrogen in an amount of 5 to 20 at %. The second light shielding layer 22 may comprise nitrogen in an amount of 7 to 13 at %.

In such a case, a laminate comprising the light shielding film 20 and a phase shift film 30 can help block an exposure light substantially.

The first light shielding layer 21 may comprise a transition metal, oxygen, and nitrogen. The second light shielding layer 22 may comprise the transition metal in an amount of 30 to 60 at %. The first light shielding layer 21 may comprise the transition metal in an amount of 35 to 55 at %. The first light shielding layer 21 may comprise the transition metal in an amount of 40 to 50 at %.

The sum of the oxygen amount and nitrogen amount of the first light shielding layer 21 may be a value of 40 to 70 at %. The sum of the oxygen amount and nitrogen amount of the first light shielding layer 21 may be a value of 45 to 65 at %. The sum of the oxygen amount and nitrogen amount of the first light shielding layer 21 may be a value of 50 to 60 at %.

The first light shielding layer 21 may comprise oxygen in an amount of 20 to 40 at %. The first light shielding layer 21 may comprise oxygen in an amount of 23 to 33 at %. The first light shielding layer 22 may comprise oxygen in an amount of 25 to 30 at %.

The first light shielding layer 21 may comprise nitrogen in an amount of 5 to 20 at %. The first light shielding layer 21 may comprise nitrogen in an amount of 7 to 17 at %. The first light shielding layer may comprise nitrogen in an amount of 10 to 15 at %.

In such a case, the first light shielding layer can help the light shielding film 20 to have excellent characteristics in extinction.

The transition metal may comprise at least any one among Cr, Ta, Ti and Hf. The transition metal may be Cr.

The first light shielding layer 21 may have a film thickness of 250 to 650 Å. The first light shielding layer 21 may have a film thickness of 350 to 600 Å. The first light shielding layer 21 may have a film thickness of 400 to 550 Å. In such a case, the first light shielding layer can help the light shielding film to block an exposure light effectively.

The second light shielding layer 22 may have a film thickness of 30 to 200 Å. The second light shielding layer 22 may have a film thickness of 30 to 100 Å. The second light shielding layer 22 may have a film thickness of 40 to 80 Å. In such a case, the second light shielding layer 22 can improve the characteristics in extinction of the light shielding film 20 and can help the side shape of the light shielding pattern film formed when the light shielding film 20 is patterned to be controlled further elaborately.

The ratio of the film thickness of the second light shielding layer 22 to the film thickness of the first light shielding layer 22 may be 0.05 to 0.3. The film thickness ratio may be 0.07 to 0.25. The film thickness ratio may be 0.1 to 0.2. In such a case, the light shielding film 20 has sufficient characteristics in extinction and the light shielding pattern film formed when the light shielding film 20 is patterned can have a side surface profile close to being perpendicular.

The amount of the transition metal of the second light shielding layer 22 may have a larger value than the amount of the transition metal of the first light shielding layer 21.

The second light shielding layer 22 may have a larger value in the amount of the transition metal compared to the first light shielding layer 21, to control a reflectivity of the light shielding film within a predetermined range for a defect test, and the like. In such a case, depending on thermal treatment condition of formed light shielding film 20, the transition metal comprised in the second light shielding layer 22 may occur recovery, recrystallization, and the growth of a grain. When the growth of a grain is not controlled, the surface of the light shielding film 20 may form a deformed outline compared to the surface before thermal treatment due to transition metal particles grown excessively. This may influence the surface energy and roughness characteristics of the light shielding film 20 and degrade the adhesive force between the light shielding film 20 and the resist film and the convenience in cleaning of the light shielding film 20.

The present disclosure controls the surface energy and roughness characteristics of the light shielding film 20 and the process conditions in thermal treatment and cooling treatment to be within a predetermined range, while the amount of the transition metal of the second light shielding layer 22 has a larger value than the amount of the transition metal of the first light shielding layer 21. Through this, embodiment can improve the adhesive force between the light shielding film 20 and the resist film and the convenience in cleaning of the light shielding film 20. In addition, the light shielding film 20 can have desired optical properties and etching characteristics.

Optical Properties of Light Shielding Film

The light shielding film 20 may have a transmittance of 1% or more with respect to a light with the wavelength of 193 nm. The light shielding film 20 may have a transmittance of 1.3% or more with respect to a light with the wavelength of 193 nm. The light shielding film 20 may have a transmittance of 1.4% or more with respect to a light with the wavelength of 193 nm. The light shielding film 20 may have a transmittance of 2% or less with respect to a light with the wavelength of 193 nm.

The light shielding film 20 may have an optical density of 1.8 or more with respect to a light with the wavelength of 193 nm. The light shielding film 20 may have an optical density of 1.9 or more with respect to a light with the wavelength of 193 nm. The light shielding film 20 may have an optical density of 3 or less with respect to a light with the wavelength of 193 nm.

In such a case, a thin film comprising the light shielding film 20 can effectively suppress the transmission of an exposure light.

Other Films

Figure 3:
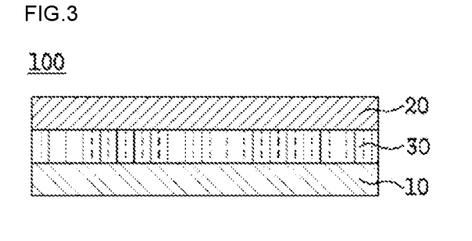
FIG. 3 is a conceptual view for illustrating a blank mask according to another embodiment disclosed by the present application.

FIG. 3 is a conceptual view for illustrating a blank mask according to another embodiment of the present application. With reference to the FIG. 3, a blank mask of an embodiment is described.

A blank mask 100 according to another embodiment of the present application comprises a light transmitting substrate 0, a phase shift film 30 disposed on the light transmitting substrate 10 and a light shielding film 20 disposed on the phase shift film 30.

The phase shift film 30 comprises a transition metal and silicon.

The light shielding film 20 may comprises a transition metal and at least any one between oxygen and nitrogen.

The light shielding film 20 may have a contact angle of 40° to 45° measured by diiodo-methane.

The surface of the light shielding film 20 may have an Rsk value of −1 to 0, and an Rku value of 7 or less.

The phase shift film 30 may be disposed between the light transmitting substrate 10 and the light shielding film 20. The phase shift film 30 is a thin film for attenuating an exposure light transmitting the phase shift film and regulating the phase difference of the light to suppress the refraction generated at the edge of a pattern, substantially.

The phase shift film 30 may have a phase difference of 170 to 190° with respect to a light with the wavelength of 193 nm. The phase shift film 30 may have a phase difference of 175 to 185° with respect to a light with the wavelength of 193 nm. The phase shift film 30 may have a transmittance of 3 to 10% with respect to a light with the wavelength of 193 nm. The phase shift film 30 may have a transmittance of 4 to 8% with respect to the wavelength of 193 nm. In such a case, the resolution of a photomask comprising the phase shift film 30 may be improved.

The phase shift film 30 may comprise a transition metal and silicon. The phase shift film 30 may comprise a transition metal, silicon, oxygen, and nitrogen. The transition metal may be molybdenum.

The description of the properties and composition of the light transmitting substrate 10 and the light shielding film 20 is overlapped with the above description and thus omitted.

A hard mask (not shown) may be disposed on the light shielding film 20. The hard mask may function as an etching mask film when the light shielding film 20 is etched. The hard mask may comprise silicon, nitrogen, and oxygen.

Photomask

Figure 4:
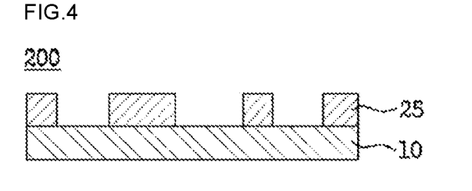
FIG. 4 is a conceptual view for illustrating a photomask according to another embodiment disclosed by the present application.

FIG. 4 is a conceptual view for illustrating a photomask according to another embodiment of the present application. With reference to the FIG. 4, a photomask of an embodiment is described.

A photomask 200 according to another embodiment of the present application comprises a light transmitting substrate 10 and a light shielding pattern film 25 disposed on the light transmitting substrate 10.

The light shielding pattern film 25 comprises a transition metal and at least any one between oxygen and nitrogen.

An upper surface of the light shielding pattern film 25 has a contact angle of 40° to 45° measured by diiodo-methane.

The upper surface of the light shielding pattern film 25 has an Rsk value of −1 to 0, and the upper surface of the light shielding pattern film 25 has an Rku value of 7 or less.

The light shielding pattern film 25 may be formed by patterning the light shielding film 20 of the blank mask 100 described in the above.

The method of measuring the value of a contact angle of the upper surface of the light shielding pattern film 25 measured by diiodo-methane is the same as the method of measuring the value of a contact angle of the light shielding film 20 measured by diiodo-methane in a blank mask 100, excepting for the measuring target which is the upper surface of the light shielding pattern film 25.

When the value of a contact angle is measured by diiodo-methane, diiodo-methane is dropped to the upper surface of the light shielding pattern film 25, and the whole area of the bottom surface of a drop of the dropped diiodo-methane meets the upper surface of the light shielding pattern film 25 completely.

When the value of a contact angle of the light shielding pattern film 25 is measured by diiodo-methane, if the upper surface of the light shielding pattern film 25 is not located at the center of each sector of the upper surface of the light shielding pattern film 25, the value of a contact angle is measured in an area located around the center.

The method of measuring Rsk value and Rku value from the upper surface of the light shielding pattern film 25 is the same as the method of measuring Rsk value and Rku value of the surface of the light shielding film 20 from the blank mask. However, when the upper surface of the light shielding pattern film 25 is not placed in an area of 1 μm vertically and horizontally located at the center of the surface of the photomask 200, the values are measured in the upper surface of the light shielding pattern film 25 around the area.

The description of the properties, composition, and structure of the light shielding pattern film 25 is overlapped with the description of the light shielding film 20 of the blank mask and thus omitted.

Manufacturing Method of Light Shielding Film

A manufacturing method of a blank mask according to one embodiment of the present application may comprise preparation of disposing a light transmitting substrate and a sputtering target in a sputtering chamber.

The manufacturing method of a blank mask according to one embodiment of the present application may comprise a film formation operation of injecting an atmosphere gas into the sputtering chamber and supplying an electric power to the sputtering target to form a light shielding film on the transparent substrate.

The film formation operation may comprise a first light shielding layer formation operation of forming a first light shielding layer on the transparent substrate; and a second light shielding layer formation operation of forming a second light shielding layer on the first light shielding layer.

The manufacturing method of a blank mask according to one embodiment of the present application may comprise a thermal treatment operation of thermally treating for a time of 5 minutes to 30 minutes in an atmosphere at a temperature of 150° C. to 330° C.

The manufacturing method of a blank mask according to one embodiment of the present application may comprise a cooling operation of cooling the light shielding film after performing the thermal treatment operation, The manufacturing method of a blank mask according to one embodiment of the present application may comprise a stabilization operation of stabilizing the blank mask after performing the cooling operation in an atmosphere at a temperature of 10° C. to 60° C.

In the preparation, a target may be selected in consideration of the composition of a light shielding film when the light shielding film is formed. The sputtering target may be applied by one target containing a transition metal. Two or more targets comprising one target containing a transition metal may be applied as the sputtering target. The target containing a transition metal may comprise the transition metal in an amount of 90 at % or more. The target containing a transition metal may comprise the transition metal in an amount of 95 at % or more. The target containing a transition metal may comprise the transition metal of 99 at %.

The transition metal may comprise at least any one among Cr, Ta, Ti, and Hf. The transition metal may comprise Cr.

The description of the transparent substrate disposed in the sputtering chamber is overlapped with the above description and thus omitted.

In preparation, a magnet may be arranged at the sputtering chamber. The magnet may be arranged at a side opposite to one side where sputtering occurs from a sputtering target.

In the light shielding film formation operation, the conditions for formation processes may be applied differently when respective layers comprised in a light shielding film are formed. Particularly, in consideration of the characteristics in surface energy, surface roughness, extinction and etching of a light shielding film, respective process conditions such as the composition of an atmosphere gas, an electric power supplied to a sputtering target, and a film formation time may be applied to be different in respective layers.

The atmosphere gas may comprise an inert gas, a reactive gas, and a sputtering gas. The inert gas is a gas not comprising an element constituting a formed film. The reactive gas is a gas comprising an element constituting a formed film. The sputtering gas is a gas ionizing in a plasma atmosphere to collide with the sputtering target.

The inert gas may comprise helium.

The reactive gas may comprise a gas comprising a nitrogen element. The gas comprising the nitrogen element may be for example, $N_2$, NO, $NO_2$, $N_2O$, $N_2O_3$, $N_2O_4$, $N_2O_5$, or the like. The reactive gas may comprise a gas comprising an oxygen element. The gas comprising the oxygen element may be $O_2$, $CO_2$, or the like. The reactive gas may comprise a gas comprising a nitrogen element and a gas comprising an oxygen element. The reactive gas may comprise a gas comprising both nitrogen element and oxygen element. The gas comprising both nitrogen element and oxygen element may be for example, NO, $NO_2$, $N_2O$, $N_2O_3$, $N_2O_4$, $N_2O_5$, or the like.

The sputtering gas may be Ar gas.

A power source for supplying an electric power to a sputtering target may be DC power source, or RF power source.

In the first light shielding layer formation process, the electric power supplied to a sputtering target may be 1.5 kW to 2.5 kW. In the first light shielding layer formation process, the electric power supplied to a sputtering target may be 1.6 kW to 2 kW.

In the first light shielding layer formation process, the ratio of the flow rate of the reactive gas to the flow rate of the inert gas of an atmosphere gas may be a value of 1.5 to 3. The flow rate ratio may be 1.8 to 2.7. The flow rate ratio may be 2 to 2.5.

The ratio of the oxygen amount to the nitrogen amount comprised in the reactive gas may be a value of 1.5 to 4. The ratio of the oxygen amount to the nitrogen amount comprised in the reactive gas may be a value of 2 to 3. The ratio of the oxygen amount to the nitrogen amount comprised in the reactive gas may be a value of 2.2 to 2.7.

In such a case, the first light shielding layer may help the light shielding film to have sufficient extinction characteristics. The etching characteristics of the first light shielding layer may be controlled to help the side surface profile of a light shielding film pattern after being patterned to have a shape close to be perpendicular to the light transmitting substrate.

The formation time of the first light shielding layer may be 200 seconds to 300 seconds. The formation time of the first light shielding layer may be 210 seconds to 240 seconds. In such a case, the first light shielding layer can help the light shielding film to have sufficient extinction characteristics.

In the second light shielding layer formation process, the electric power supplied to a sputtering target may be applied to be a value of 1 kW to 2 kW. In the second light shielding layer formation process, the electric power supplied to a sputtering target may be applied to be a value of 1.2 kW to 1.7 kW.

In the second light shielding layer formation process, the ratio of the flow rate of the reactive gas to the flow rate of the inert gas of an atmosphere gas may be a value of 0.3 to 0.8. The ratio may be 0.4 to 0.6.

In the second light shielding layer formation process, the ratio of the oxygen amount to the nitrogen amount comprised in the reactive gas may be 0.3 or less. The ratio of the oxygen amount to the nitrogen amount comprised in the reactive gas may be 0.1 or less. The ratio of the oxygen amount to the nitrogen amount comprised in the reactive gas may be 0.001 or more.

In such a case, the affinity of a light shielding film with respect to a nonpolar solution can be controlled within a range desired in the present disclosure, and the light shielding film can have stable extinction characteristics.

The formation time of a second light shielding layer may be 10 seconds to 30 seconds. The formation time of a second light shielding layer may be 15 seconds to 25 seconds. In such a case, the second light shielding layer can help suppressing the transmission of an exposure light.

In the thermal treatment operation, the light shielding film after completion of the film formation operation may be thermally treated. In detail, the substrate after the formation of the light shielding film is disposed in a thermal treatment chamber, and subsequently the thermal treatment may be performed.

Through the thermal treatment of the light shielding film, the stress formed in the light shielding film can be decreased, and density of the light shielding film can be further increased. When thermal treatment is applied to the light shielding film, recovery and recrystallization of the transition metal comprised in the light shielding film may occur, and the stress formed in the light shielding film can be effectively decreased. However, in the thermal treatment operation, when the process conditions such as temperature and time for thermal treatment are not controlled, excessive grain growth may occur in the light shielding film, and due to the grain growth not controlled in the size, the surface profile of the light shielding film may be considerably deformed compared to the state before the thermal treatment. This may influence the surface energy and roughness characteristics of the light shielding film.

The present disclosure may control the time and temperature for thermal treatment in the thermal treatment operation, and may control the cooling speed, the cooling time, the atmosphere during cooling, and the like in the cooling operation to be described below. Thereby the embodiment can effectively decrease the internal stress formed in the light shielding film, and simultaneously the surface of the light shielding film can have characteristics in the surface energy and roughness predetermined in the embodiment.

The thermal treatment operation may be performed at a temperature of 150° C. to 330° C. The thermal treatment operation may be performed at a temperature of 180° C. to 300° C.

The thermal treatment operation may be performed for a time of 5 minutes to 30 minutes. The thermal treatment operation may be performed for a time of 10 minutes to 20 minutes.

In such a case, the internal stress formed in the light shielding film can be effectively removed, and it can help suppressing excessive growth of a transition metal grain caused from thermal treatment.

In the cooling operation, the light shielding film after completion of the thermal treatment can be cooled. At a substrate surface side of a blank mask after completion of the thermal treatment operation, a cooling plate having a cooling temperature predetermined in an embodiment may be disposed. In the cooling operation, the cooling speed of a blank mask can be controlled by adjusting the gap between the blank mask and the cooling plate and applying a process condition such as applying an atmosphere gas.

For the blank mask, the cooling operation may be applied within 2 minutes after completion of the thermal treatment operation. In such a case, the growth of a transition metal grain due to residual heat within the light shielding film can be effectively suppressed.

Pins having a regulated length are set to respective vertexes of the cooling plate, and a blank mask may be arranged on the pins to have a substrate facing the cooling plate, thereby controlling the cooling speed of the blank mask.

In addition to the cooling method by the cooling plate, an inert gas may be injected to atmosphere where the cooling operation proceeds to cool the blank mask. In such a case, the residual heat in the side of the light shielding surface of the blank mask whose cooling efficiency is slightly degraded can be further effectively removed.

The inert gas may be for example, helium.

In the cooling operation, the cooling temperature applied to the cooling plate may be a temperature of 10 to 30° C. The cooling temperature may be a temperature of 15 to 25° C.

In the cooling operation, the gap between the blank mask and the cooling plate may be a value of 0.01 to 30 mm. The gap may be a value of 0.05 to 5 mm. The gap may be a value of 0.1 to 2 mm.

In the cooling operation, the cooling speed of the blank mask may be a value of 10 to 80° C./min. The cooling speed may be a value of 20 to 75° C./min. The cooling speed may be a value of 40 to 70° C./min.

In such a case, the growth of the transition metal grain after completion of thermal treatment may be suppressed and it can help the surface of the light shielding film to have characteristics in the surface energy and roughness within the ranges predetermined in embodiments.

In the stabilization operation, the blank mask after passing through the cooling operation can be stabilized. Through this, damage of the blank mask due to rapid variations in the temperature can be prevented.

The method of stabilizing a blank mask after passing through the cooling operation may be various. As one example, the blank mask after passing through the cooling operation is separated from the cooling plate, and after that, may be left for a certain time in the atmosphere at a room temperature. As another example, the blank mask after passing through the cooling operation is separated from the cooling plate, and after that, may be stabilized for a time of 10 minutes to 60 minutes in the atmosphere at a temperature of 15° C. to 30° C. At this time, the blank mask may be rotated at a speed of 20 rpm to 50 rpm. As another example, a gas which does not react with the blank mask may be injected in a flow rate of 5 L/min to 10 L/min for a time of 1 minute to 5 minutes. At this time, the gas may have a temperature of 20° C. to 40° C.

Manufacturing Method of Semiconductor Element

A manufacturing method of a semiconductor element according to another embodiment of the present application comprises preparation of disposing a light source, a photomask, and a semiconductor wafer where a resist film have been applied, an exposure operation of selectively transmitting the light incident from the light source through the photomask on the semiconductor wafer to be transferred, and a development operation of developing a pattern on the semiconductor wafer.

The photomask comprises a transparent substrate and a light shielding pattern film disposed on the transparent substrate.

The light shielding pattern film comprises a transition metal and at least any one between oxygen and nitrogen.

An upper surface of the light shielding pattern film has a contact angle of 40° to 45° measured by diiodo-methane.

The upper surface of the light shielding pattern film has an Rsk value of −1 to 0, and the upper surface of the light shielding pattern film has an Rku value of 7 or less.

In the preparation, the light source is a device which can generate an exposure light with a short wavelength. The exposure light may be a light with a wavelength of 200 nm or less. The exposure light may be an ArF light with the wavelength of 193 nm.

A lens may be additionally arranged between the photomask and the semiconductor wafer. The lens has a function of miniaturing the circuit pattern shape of the photomask and transferring miniatured circuit on a semiconductor wafer. Any lens ordinarily applicable to an exposure process of ArF semiconductor wafer may be applied without limitation. For example, the lens may be a lens consisting of calcium fluoride ($CaF_2$).

In the exposure operation, the exposure light may be selectively transmitted on a semiconductor wafer through a photomask. In such a case, chemical denaturation may occur in a portion where the exposure light is incident within a resist film.

In the development operation, the semiconductor wafer after completion of the exposure operation is treated with a developing solution for developing a pattern on the semiconductor wafer. When the applied resist film is a positive resist, a portion where an exposure light is incident within the resist film may be dissolved by a developing solution. When the applied resist film is a negative resist, a portion where an exposure light is not incident within the resist film may be dissolved by a developing solution. The resist film is formed into a resist pattern by the treatment with the developing solution. A pattern may be formed on the semiconductor wafer by taking the resist pattern as a mask.

The description of a photomask is overlapped with the above description and thus omitted.

Hereinafter, the further detailed description of specific example embodiments will be made.

Manufacture Example: Formation of Light Shielding Film

Example 1: a light transmitting substrate made from quartz in the size of 6-inched width, 6-inched length, and 0.25-inched thickness was disposed in a chamber of DC sputtering apparatus. A chrome target was arranged in the chamber to form a T/S distance of 255 mm, and the angle of 25 degrees between the substrate and the target.

Thereafter, the atmosphere gas in which Ar of 21 volume %, $N_2$ of 11 volume %, $CO_2$ of 32 volume %, and He of 36 volume % had been mixed was introduced into the chamber, the electric power of 1.85 KW was supplied to a sputtering target, and thereby a sputtering process was performed for 250 seconds to form a first light shielding layer.

After the formation of the first light shielding layer, the atmosphere gas in which Ar of 57 volume % and $N_2$ of 43 volume % had been mixed was introduced into the chamber, the electric power supplied to the sputtering target was applied to be 1.5 kW, and a sputtering process was performed for 25 seconds to manufacture a blank mask sample in which the second light shielding layer had been formed.

The sample after the formation of the second light shielding layer was disposed in the chamber for thermal treatment, and thermal treatment was performed for 15 minutes at the atmosphere temperature of 200° C.

A cooling plate whose cooling temperature was applied to be 23° C. was installed in the substate side of the sample after passing through the thermal treatment. The gap between the substrate and the cooling plate of the sample was adjusted to have a cooling speed of 36° C./min measured at the surface of the light shielding film of the sample, and a cooling operation was performed for 5 minutes.

After completion of the cooling treatment, the sample was stabilized for 15 minutes by keeping it in the atmosphere at a temperature of 20° C. to 25° C.

Example 2: A blank mask sample was manufactured under the same condition as Example 1. However, the sample was thermally treated at 250° C. after the formation of the light shielding film, cooling treatment was performed for 7 minutes, and the cooled sample was stabilized for 20 minutes.

Example 3: A blank mask sample was manufactured under the same condition as Example 1. However, the sample was thermally treated at 250° C. after the formation of the light shielding film, the cooling speed measured at the surface of the light shielding film of the sample was applied to be 30° C./min, and thereby cooling treatment was performed for 8 minutes.

Example 4: A blank mask sample was manufactured under the same condition as Example 1. However, the sample was thermally treated at 300° C. after the formation of the light shielding film, cooling treatment of the sample treated with heat was performed for 8 minutes, and the cooled sample was stabilized for 30 minutes.

Example 5: A blank mask sample was manufactured under the same condition as Example 1. However, the sample was thermally treated at 300° C., a helium gas was injected to the sample in the flow rate of 300 sccm during cooling treatment, thereby having a cooling speed of 56° C./min measured at the surface of the light shielding film of the sample, and the cooled sample was stabilized for 45 minutes.

Comparative Example 1: A blank mask sample was manufactured under the same condition as Example 1. However, thermal treatment, cooling treatment, and stabilization were not performed for the formed sample.

Comparative Example 2: A blank mask sample was manufactured under the same condition as Example 1. However, the sample was thermally treated at 250° C. after the formation of the light shielding film 20, and cooling treatment of the sample was performed by natural cooling in the atmosphere without using a cooling plate. During the natural cooling, the atmosphere temperature of 23° C., the cooling time of 120 minutes, and the cooling speed of 2° C./min measured at the surface of the light shielding film of the sample were applied. After the cooling treatment, stabilization was not performed.

Comparative Example 3: A blank mask sample was manufactured under the same condition as Example 1. However, the sample was thermally treated at 300° C. after the formation of the light shielding film, and a helium gas was injected to the sample in the flow rate of 300 sccm during cooling treatment, thereby having a cooling speed of 56° C./min. Stabilization was not performed for the cooled sample.

The descriptions of conditions for thermal treatment, cooling treatment, and stabilization of each Example or Comparative Example were shown in Table 1 below.

Evaluation Example: Measurement of Characteristics Related to Surface Energy of Light Shielding Film The surface of the light shielding film of the sample of each Example or Comparative Example was trisected vertically and horizontally and divided into total nine sectors. Pure water of 0.8 to 1.2 μL, for example, 1 μL was dropped to the center of each sector with an interval of about 2 seconds, and the contact angle of pure water of each sector was measured by a surface analyzer. The average value of the measured values of contact angles of respective sectors was calculated as the contact angle of the light shielding film measured with pure water. After pure water was dropped, diiodo-methane of 0.8 to 1.2 μL, for example, 1 μL was dropped to the spot spaced apart from the spot where pure water was dropped, and the contact angle of diiodo-methane of each sector was measured by a surface analyzer. The average value of measured values of contact angles of respective sectors was calculated as the contact angle of the light shielding film measured with diiodo-methane. The surface energy, the polar component of the surface energy, and dispersion component were calculated from the contact angle values of the light shielding film measured and calculated by pure water and diiodo-methane.

The surface energy of the pure water used in the measurement is 72.8 mN/m, the polar component of the surface energy are 51 mN/m, and the dispersion component are 21.8 mN/m. The surface energy of the diiodo-methane used in the measurement is 50.8 mN/m, the polar component of the surface energy are 0 mN/m, and the dispersion component are 50.8 mN/m.

The surface analyzer was MSA (Mobile Surface Analyzer) double type model available from KRÜSS corporation.

The measured values of respective Examples and Comparative Examples were described in Table 2 below.

Evaluation Example: Measurement of Surface Roughness Characteristics of Light Shielding Film The Rsk and Rku values of the surface of the light shielding film of each Example or Comparative Example were measured in accordance with ISO_4287.

In detail, XE-150 model available from PARK SYSTEM applied with PPP_NCHR which was Cantilever model available from PARK SYSTEM as a probe in the area of 1 μm vertically and horizontally of the center of the light shielding film was used to measure Rsk value and Rku value in Non-contact mode at a scan speed of 0.5 Hz.

The measured result of respective Examples and Comparative Examples was described in Table 3.

Evaluation Example: Evaluation of Resist Film Coating

A resist film was applied on the light shielding film of each Example or Comparative Example by injecting a resist solution of XFP255 model available from FUJI corporation in a spin coating method. Subsequently, the applied resist film was dried for 620 seconds at 140° C. to form a resist film in the thickness of 1300 Å.

Thereafter, the surface where the resist film had been applied of each Example or Comparative Example was divided into seven areas vertically and horizontally. In the respective areas, the thickness of a resist film was measured by using a MG Pro model test available from NANOVIEW. When the value of subtracting the minimum from the maximum within the thickness values of a resist film measured from each area was less than 130 Å, it was evaluated as Pass, and when the value was 130 Å or more, it was evaluated as Fail.

The evaluated result of respective Examples and Comparative Examples was described in Table 3 below.

Evaluation Example: Evaluation of Cleaning Effect of Light Shielding Film

The sample of each Example or Comparative Example kept in SMIF (Standard Mechanical InterFace) was opened to be left allowing the sample surface to be polluted. An area of 146 mm vertically and horizontally within the surface of the light shielding film of the left sample was inspected by M6641S tester available from LASERTEC corporation, and the number of particles was measured. The wavelength of a testing light used in the inspection for particles was applied to be 532 mm.

Thereafter, the sample surface where pollution had been ascertained was cleaned.

The cleaning was performed as follows. The surface of the light shielding film of the sample was activated by irradiation of a light with the wavelength of 172 nm for 120 seconds. After the activation, a carbonated water was injected to the sample surface for 1 minute and 30 seconds in the flow rate of 1500 ml/min, thereby performing rinsing. After the rinsing, while the sample was rotated at 80 rpm, SC-1 solution in the flow rate of 800 ml/min and hydrogen water in the flow rate of 600 ml/min were injected at the same time for 8 minutes and 30 seconds to perform cleaning. The SC-1 solution was applied by a solution comprising $NH_4OH$ of 0.1 volume %, $H_2O_2$ of 0.08 volume %, and $H_2O$ of 99.82 volume %. After the cleaning, carbonated water was injected to the sample surface for 1 minute and 30 seconds in the flow rate of 1500 ml/min to perform rinsing.

Thereafter, the number of particles was inspected from the surface of the light shielding film of the sample after completion of cleaning by using the same method as the method of inspecting particles of the sample before being cleaned. When all particles were removed from the surface of the light shielding film after the cleaning, the measuring result was evaluated as O, when particles of 70% or more were removed, it was evaluated as A, and when particles less than 70% were removed, it was evaluated as X.

The measured result of respective Examples and Comparative Examples was described in Table 3 below.

Evaluation Example: Evaluation of Additional Particle Measurement within Light Shielding Film The sample of each Example or Comparative Example kept in SMIF (Standard Mechanical InterFace) was opened and loaded in the internal of an inspector of M6641S model available from LASERTEC corporation and the number of particles was measured in an area of 146 mm vertically and horizontally within the surface of the light shielding film. The wavelength of the testing light used in the particle inspection was applied to be 532 mm.

Thereafter, cleaning was performed to the sample surface. In detail, the surface of the light shielding film of the sample was irradiated for 120 seconds by a light with the wavelength of 172 nm to be activated. After the activation, carbonated water was injected in the flow rate of 1500 ml/min for 1 minute and 30 seconds, thereby performing rinsing. After the rinsing, while the sample was rotated at 80 rpm, SC-1 solution in the flow rate of 800 ml/min and hydrogen water in the flow rate of 600 ml/min were injected to the surface of the light shielding film at the same time for 8 minutes and 30 seconds, thereby performing cleaning. The SC-1 solution was applied by a solution comprising $NH_4OH$ of 0.1 volume %, $H_2O_2$ of 0.08 volume %, and $H_2O$ of 99.82 volume %. After the cleaning, carbonated water was injected to the sample surface in the flow rate of 1500 ml/min for 1 minute and 30 seconds, thereby performing rinsing.

Thereafter, the number of particles present in the surface of the light shielding film of the sample after being cleaned was inspected by the same method as the method of inspecting particles of the sample before being cleaned. Compared to the light shielding film before being cleaned, when a newly additional particle was not measured, it was evaluated as X, and when a newly additional particle was measured, it was evaluated as A.

The evaluation result of respective Examples and Comparative Examples was described in Table 3 below.

TABLE 1

| | Temperature for Thermal Treatment (° C.) | Time for Thermal Treatment (Minute) | Whether Cooling Plate Is Used | The Flow rate of Helium Gas (sccm) | Temperature of Cooling Plate (° C.) | Cooling Time (Minute) | Cooling Speed (° C./minute) | Temperature for Stabilization (° C.) | Stabilization Time (Minute) |
|---|---|---|---|---|---|---|---|---|---|
| Example 1 | 200 | 15 | O | — | 23 | 5 | 36 | 20 to 25 | 15 |
| Example 2 | 250 | 15 | O | — | 23 | 7 | 36 | 20 to 25 | 20 |
| Example 3 | 250 | 15 | O | — | 23 | 8 | 30 | 20 to 25 | 15 |
| Example 4 | 300 | 15 | O | — | 23 | 8 | 36 | 20 to 25 | 30 |
| Example 5 | 300 | 15 | O | 300 | 23 | 5 | 56 | 20 to 25 | 45 |
| Comparative Example 1 | — | — | — | — | — | — | — | — | — |
| Comparative Example 2 | 250 | 15 | X | — | 23 (Atmosphere Temperature) | 120 | 2 | — | — |
| Comparative Example 3 | 300 | 15 | O | 300 | 23 | 5 | 56 | — | — |

TABLE 2

| | $\theta_1(°)^{1)}$ | $\theta_2(°)^{2)}$ | $\theta_2/\theta_1$ | Surface Energy of Light shielding film (mN/m) | Polar component of the surface energy of Light shielding film (mN/m) | Dispersion component of the surface energy of Light shielding film (mN/m) | The Ratio of Dispersion component of the surface energy Compared to Surface Energy |
|---|---|---|---|---|---|---|---|
| Example 1 | 71.58 | 42.91 | 0.599 | 45.25 | 7.13 | 38.12 | 0.842 |
| Example 2 | 72.71 | 43.56 | 0.599 | 44.5 | 6.73 | 37.78 | 0.849 |
| Example 3 | 73.11 | 43.75 | 0.598 | 44.25 | 6.58 | 37.68 | 0.852 |
| Example 4 | 74.25 | 43.9 | 0.591 | 43.71 | 6.11 | 37.6 | 0.860 |
| Example 5 | 74.46 | 44.95 | 0.604 | 43.21 | 6.17 | 37.04 | 0.857 |
| Comparative Example 1 | 68.31 | 39.45 | 0.578 | 48.02 | 8.13 | 39.89 | 0.831 |
| Comparative Example 2 | 68.95 | 39.03 | 0.566 | 47.87 | 7.77 | 40.09 | 0.837 |
| Comparative Example 3 | 75.15 | 45.43 | 0.605 | 42.73 | 5.95 | 36.78 | 0.861 |

$^{1)}\theta_1$ is the contact angle of the surface of the light shielding film measured by pure water.
$^{2)}\theta_2$ is the contact angle of the surface of the light shielding film measured by diiodomethane.

1) $\theta_1$ is the contact angle of the surface of the light shielding film measured by pure water.
2) $\theta_2$ is the contact angle of the surface of the light shielding film measured by diiodo-methane.

TABLE 3

| | Rsk | Rku | Cleaning Effect | Resist Coating | Additional Particle Evaluation |
|---|---|---|---|---|---|
| Example 1 | −0.885 | 4.125 | ○ | P | X |
| Example 2 | −0.651 | 3.795 | ○ | P | X |
| Example 3 | −0.714 | 3.923 | ○ | P | X |
| Example 4 | −0.399 | 2.972 | ○ | P | X |
| Example 5 | −0.204 | 2.845 | ○ | P | X |
| Comparative Example 1 | −1.316 | 9.245 | Δ | F | Δ |
| Comparative Example 2 | −1.154 | 7.352 | Δ | F | Δ |
| Comparative Example 3 | −1.168 | 5.054 | X | F | X |

All the cases of Examples in which the contact angle of the surface of the light shielding film measured by diiodomethane, the Rsk and Rku values, and the like were controlled within the range predetermined in embodiments were evaluated as P for the cleaning effect, however, Comparative Examples 1 and 2 were evaluated as A, and the case of Comparative Example 3 was evaluated as X.

For evaluation of resist film coating, all Examples were evaluated as P, however, all Comparative Examples were evaluated as F.

For evaluation of cleaning effect, Examples were evaluated as O, however, Comparative Examples were evaluated as A or X.

For evaluating whether an additional particle was present, Examples did not show an additional particle, however, Comparative Examples 1 and 2 were evaluated as A.

Although the exemplary embodiments have been described in detail, the scope of the present invention is not limited thereto, and modifications and alterations made by those skilled in the art using the basic concept of the present invention defined in the following claims fall within the scope of the present invention.

DESCRIPTION OF THE FIGURE NUMBERS

100: Blank Mask
10: Light Transmitting Substrate
20: Light shielding film
21: First Light shielding Layer
22: Second Light shielding Layer
30: Phase Shift Film
200: Photomask
25: Light shielding Pattern Film

What is claimed is:

1. A blank mask comprising a transparent substrate and a light shielding film disposed on the transparent substrate,
   wherein the light shielding film comprises a transition metal and at least one selected from the group consisting of oxygen and nitrogen,
   wherein the light shielding film comprises a first light shielding layer and a second light shielding layer disposed on the first light shielding layer,
   wherein an amount of the transition metal in the first light shielding layer is 35 to 55 at %,
   wherein an amount of oxygen in the first light shielding layer is 23 to 33 at %,
   wherein an amount of the transition metal in the second light shielding layer is greater than an amount of the transition metal in the first light shielding layer, and
   wherein a surface of the light shielding film has a first contact angle of 40° to 45° measured by using diiodo-methane as a first liquid contacting the surface of the light shielding film.

2. The blank mask of claim 1, wherein the surface of the light shielding film has an Rsk value, which is a skewness value, of −1 to 0.

3. The blank mask of claim 1, wherein the surface of the light shielding film has an Rku value, which is kurtosis value, of 7 or less.

4. The blank mask of claim 1, wherein a ratio of a dispersion component of a surface energy of the surface of the light shielding film to the surface energy of the surface of the light shielding film is 0.84 to 0.865.

5. The blank mask of claim 4, wherein the dispersion component of the surface energy of the surface of the light shielding film is 37 mN/m to 40 mN/m.

6. The blank mask of claim 4, wherein the light shielding film has the surface energy of 43 mN/m to 47 mN/m.

7. The blank mask of claim 1, wherein the first contact angle divided by a second contact angle of the light shielding film measured by using pure water as a second liquid contacting the surface of the light shielding film is 0.58 to 0.604.

8. The blank mask of claim 1, wherein the surface of the light shielding film has an Rku value of 2 or more.

9. The blank mask of claim 1, wherein the transition metal further comprises at least one selected from the group consisting of Cr, Ta, Ti, and Hf.

10. A photomask comprising a transparent substrate and a light shielding pattern film disposed on the transparent substrate,
wherein the light shielding pattern film comprises a transition metal and at least one selected from the group consisting of oxygen and nitrogen,
wherein the light shielding film comprises a first light shielding layer and a second light shielding layer disposed on the first light shielding layer,
wherein an amount of the transition metal in the first light shielding layer is 35 to 55 at %,
wherein an amount of oxygen in the first light shielding layer is 23 to 33 at %,
wherein an amount of the transition metal in the second light shielding layer is greater than an amount of the transition metal in the first light shielding layer, and
wherein an upper surface of the light shielding pattern film has a contact angle of 40° to 45° measured by using diiodo-methane as a liquid contacting the surface of the light shielding film.

11. The photomask of claim 10, wherein the upper surface of the light shielding pattern film has an Rsk value, which is a skewness value, of −1 to 0.

12. The photomask of claim 10, wherein the upper surface of the light shielding pattern film has an Rku value, which is kurtosis value, of 7 or less.

13. A method of manufacturing a semiconductor element comprising:
preparing a light source, a photomask, and a semiconductor wafer, onto which a resist film has been applied;
selectively transmitting a light incident from the light source through the photomask onto the semiconductor wafer; and
developing a pattern on the semiconductor wafer,
wherein the photomask comprises a transparent substrate and a light shielding pattern film disposed on the transparent substrate,
wherein the light shielding pattern film comprises a transition metal and at least one selected from the group consisting of oxygen and nitrogen,
wherein the light shielding film comprises a first light shielding layer and a second light shielding layer disposed on the first light shielding layer,
wherein an amount of the transition metal in the first light shielding layer is 35 to 55 at %,
wherein an amount of oxygen in the first light shielding layer is 23 to 33 at %,
wherein an amount of the transition metal in the second light shielding layer is greater than an amount of the transition metal in the first light shielding layer, and
wherein an upper surface of the light shielding pattern film has a contact angle of 40° to 45° measured by using diiodo-methane as a liquid contacting the surface of the light shielding film.

14. The method of claim 13, wherein the upper surface of the light shielding pattern film has an Rsk value, which is a skewness value, of −1 to 0.

15. The method of claim 13, wherein the upper surface of the light shielding pattern film has an Rku value, which is kurtosis value, of 7 or less.

* * * * *